(12) United States Patent
Yeo

(10) Patent No.: US 7,763,909 B2
(45) Date of Patent: Jul. 27, 2010

(54) IMAGE SENSOR AND METHOD FOR MANUFACTURING THE SAME

(75) Inventor: In Guen Yeo, Gwangsan-gu (KR)

(73) Assignee: Dongbu Hitek Co., Ltd., Seoul (KR)

( * ) Notice: Subject to any disclaimer, the term of this patent is extended or adjusted under 35 U.S.C. 154(b) by 3 days.

(21) Appl. No.: 12/114,559

(22) Filed: May 2, 2008

(65) Prior Publication Data

US 2008/0272417 A1 Nov. 6, 2008

(30) Foreign Application Priority Data

May 3, 2007 (KR) .................. 10-2007-0042909

(51) Int. Cl.
*H01L 31/0328* (2006.01)

(52) U.S. Cl. .................. 257/184; 257/192; 257/222; 257/291; 257/E27.062

(58) Field of Classification Search .............. 257/184, 257/187, 192, 201, 222, 226, 291, 461, 509, 257/927

See application file for complete search history.

(56) References Cited

U.S. PATENT DOCUMENTS

| 2006/0132632 A1* | 6/2006 | Ihara | 348/300 |
| 2006/0170018 A1* | 8/2006 | Kuriyama | 257/291 |
| 2006/0275990 A1* | 12/2006 | Itonaga | 438/286 |

FOREIGN PATENT DOCUMENTS

KR 10-2005-0088823 3/2007

* cited by examiner

*Primary Examiner*—Wai-Sing Louie
(74) *Attorney, Agent, or Firm*—Saliwanchik, Lloyd & Saliwanchik

(57) ABSTRACT

An image sensor and method for manufacturing the same are provided. The image sensor can include an isolation area and active area on a substrate; a photodiode area and a transistor area provided on the active area; a gate insulating layer on the transistor area; and a gate electrode provided on the gate insulating layer and a portion of the photodiode area by extending over a portion of the isolation area between the transistor area and the photodiode area. In one embodiment, the gate electrode can be a gate electrode of a drive transistor of a 3-T type image sensor.

5 Claims, 1 Drawing Sheet

IMAGE SENSOR AND METHOD FOR MANUFACTURING THE SAME

CROSS-REFERENCE TO RELATED APPLICATION

The present application claims the benefit under 35 U.S.C. §119 of Korean Patent Application No. 10-2007-0042909, filed May 3, 2007, which is hereby incorporated by reference in its entirety.

BACKGROUND

An image sensor is a semiconductor device for converting an optical image into an electrical signal. The image sensor is mainly classified as a charge coupled device (CCD) or a complementary metal oxide silicon (CMOS) image sensor.

The CMOS image sensor includes a photodiode and a MOS transistor in each unit pixel, and sequentially detects the electric signals of each unit pixel through a switching scheme to display an image.

Among the conventional image sensors, a 3-T type image sensor includes one photodiode area and three transistors, that is, a reset transistor, a drive transistor and a select transistor.

According to the related art, contacts are formed at predetermined portions of the photodiode area and at the drive transistor such that the photodiode area can be electrically connected to the drive transistor by means of metal filled in the contacts.

However, according to the related art, an etching process must be performed to form the contact in the photodiode area. Such an etching process may exert an influence upon the crystal structure of the photodiode area, thereby causing noise such as dark defects.

In addition, according to the related art, the contact and metal are provided at an upper portion of the photodiode area, so that light incident into the photodiode area may be interfered with by the contact and metal, lowering the photo-electronic effect. In addition, such a contact and metal may selectively block light incident into the photodiode area from the transistor area, causing image variation when the image is outputted.

BRIEF SUMMARY

Embodiments of the present invention provide an image sensor and a manufacturing method thereof, capable ensuring a sufficient metal interconnection margin and improving image quality by inhibiting color variation in an image.

According to an embodiment, an image sensor can include a substrate having an active area and an isolation area; a photodiode area and a transistor area on the active area; a gate insulating layer on the transistor area; and a gate electrode on the gate insulating layer, the gate electrode extending over a portion of the isolation area onto the photodiode area.

According to an embodiment, a method of manufacturing an image sensor can include: forming an active area and an isolation area on a substrate; forming a photodiode area and a transistor area on the active area; forming a gate insulating layer on the transistor area; and forming a gate electrode on the gate insulating layer and over a portion of the isolation area onto a portion of the photodiode area.

DETAILED DESCRIPTION

Hereinafter, an image sensor and a manufacturing method thereof will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
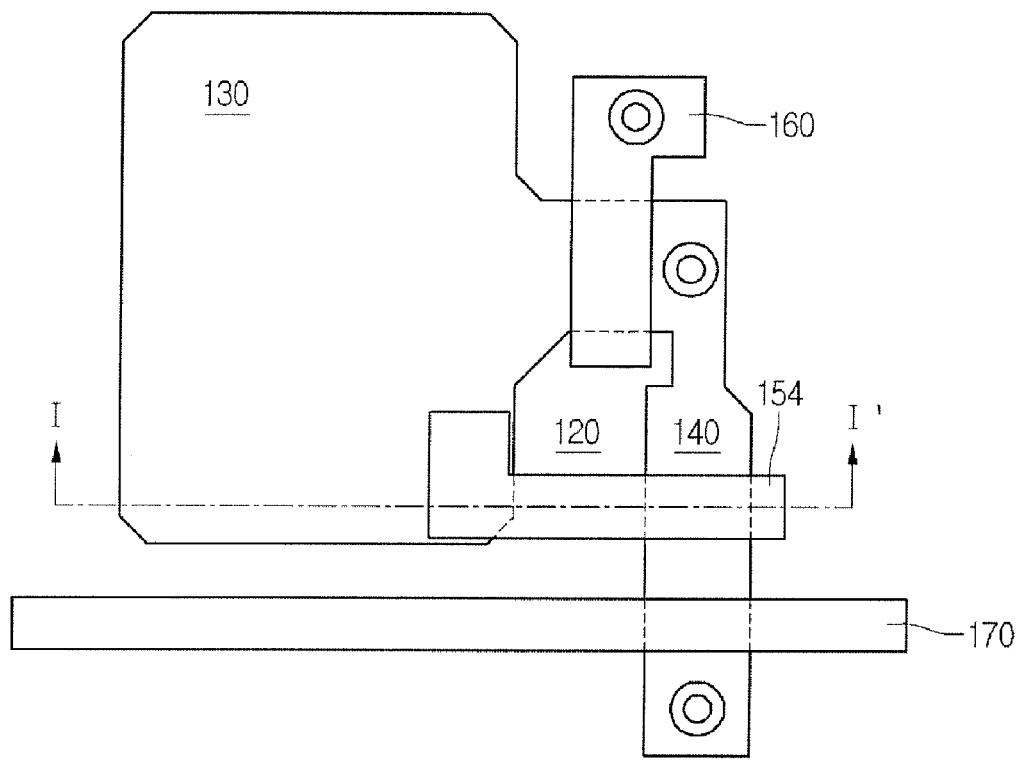
FIG. 1 is a plan view of an image sensor according to an embodiment.
Figure 2:
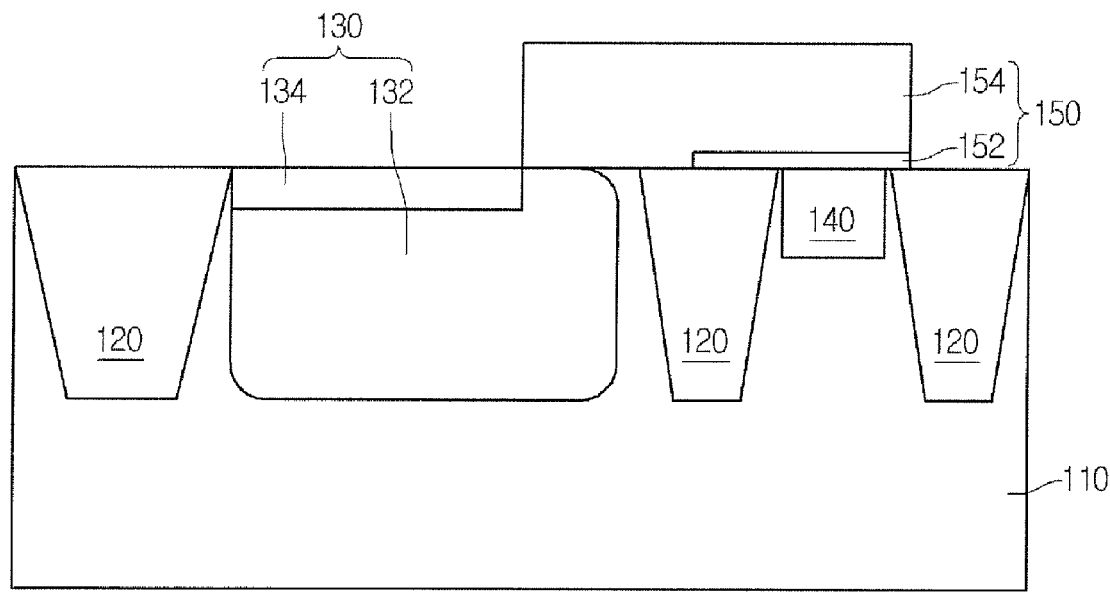
FIG. 2 is a cross-sectional view taken along line I-I' of FIG. 1, according to an embodiment.

Referring to FIGS. 1 and 2, an image sensor according to an embodiment can include a substrate 110 having an active area and an isolation area 120. The active area can include a photodiode area 130 and a transistor area 140. A gate insulating layer 152 can be provided on the transistor area 140, and a gate electrode 154 can be provided on a portion of the gate insulating layer 152 and the photodiode area 130 by passing over a portion of the isolation area 120 from the transistor area to the photodiode area 130. The reference number 170 represents the gate electrode for a select transistor according to one embodiment.

According to an embodiment, the gate electrode 154 can be the gate of a drive transistor 150 for a 3-T type CMOS image sensor.

The gate electrode 154 can be used to electrically connect the photodiode area 130 to the transistor area 140 without requiring a contact and metal line.

In many embodiments, the gate electrode 154 can be formed with polysilicon.

The portion of the transistor area 140 having the transistor 150 can be electrically isolated from the photodiode area 130 by the isolation layer 120.

If light is incident to such a device, a photo-electronic effect occurs in the photodiode area 130, so that electrons are generated. These electrons are converted into signals to form an image.

In one embodiment, the photodiode area 130 can include a first ion implantation area 132 and a second ion implantation area 134 formed on the first ion implantation area 132.

For example, the photodiode area 130 can include an N-doped area 132 and a P-doped area 134 formed on the N-doped area 132. The N-doped area 132 and the P-doped area 134 can provide a PN junction, so that a depletion layer (not shown) is formed. Of course, in other embodiments, the photodiode area 130 can be formed having a structure according to any known methods in the art.

If the photo-electronic effect occurs in the depletion layer, electrons are moved toward the N-doped area 132 and collected in the photodiode area 130. At this time, image sensitivity is determined according to the amount of electrons, which are collected in the photodiode area 130 corresponding to the amount of incident light. In addition, the image sensitivity may be influenced by the amount of a peripheral depletion area of the photodiode area 130 where electrons are collected due to the photo-electronic effect.

As the light is incident into the photodiode area 130, electrons are generated due to the photo-electronic effect and the electrons are collected in the photodiode area 130. Thus, the electric potential of the photodiode area 130 becomes reduced and the electric potential applied to the drive transistor 150 is also reduced. Due to variation of the electric potential applied to the drive transistor 150, voltage of a signal which is output from a voltage source, Vdd (not shown), through the drive transistor 150 is reduced. The image sensor reads the voltage variation and outputs signals based on the voltage variation, thereby producing an image.

According to many embodiments of the subject the image sensor, the contact and the metal interconnection, which are typically formed on the photodiode area to connect the photodiode area to the drive transistor, can be omitted. Thus, the light incident into the photodiode area from the transistor area may not be blocked, so that color variation in the image can be reduced.

In addition, according to certain embodiments, because the contact and the metal interconnection connecting the photodiode area to the drive transistor can be omitted, the metal interconnection margin can be sufficiently ensured when designing the pixels, thereby improving space utilization.

Hereinafter, a method of manufacturing the image sensor according to an embodiment will be described with reference to FIGS. 1 and 2.

First, the active area and the isolation area 120 are defined on the substrate 110. The isolation area 120 can be used to define the active area. The isolation area 120 can include a shallow trench isolation (STI) layer or a LOCOS.

The photodiode area 130 and the transistor area 140 can be formed on the active area. Photodiodes are provided on the photodiode area 130, and various transistors are provided on the transistor area 140. In certain embodiments, the photodiode area 130 and the transistor area 140 can be formed on the active area by implanting ions into the active area.

A gate insulating layer 152 can be formed on the transistor area 140. In an embodiment, in order to form the gate insulating layer 152 on the transistor area 140, an insulating layer (not shown) can be formed on the entire surface of the substrate 110 including the active area. Then, the insulating layer is etched such that the gate insulating layer 152 remains on the transistor area 140.

In one embodiment, for example, the gate insulating layer 152 can be formed on the transistor area 140 by removing the insulating layer (not shown) on the photodiode area 130.

The gate electrode 154 can be formed on the gate insulating layer 152 and the photodiode area 130.

The gate electrode 154 is used to electrically connect the photodiode area 130 to the portion of the gate electrode on the transistor area 140. In detail, by being formed on a portion of the photodiode area 130, the gate electrode 154 provides its own electrical connection to the photodiode area 130 without the need of contacts and a separate metal layer.

In addition, the gate electrode 154 can be formed by using polysilicon. According to embodiments, the gate electrode 154 can serve as a metal interconnection between the photodiode and the gate (154) of the drive transistor 150.

According to a method of manufacturing the image sensor, the drive transistor 150 can partially overlap with the photodiode area 130. The insulating layer formed on the overlapping portion is removed such that the gate of the drive transistor 150 can electrically connect to the photodiode area 130. In an embodiment, the insulating layer used to form the gate insulating layer 152 can be left remaining between the Vdd (not shown) and an output terminal, such that the signals can be amplified.

According to embodiments of the method of manufacturing an image sensor, it is not necessary to form the contact and the metal interconnection conventionally used to connect the photodiode area to the drive transistor.

Accordingly, by omitting the contact and the metal interconnection for connecting the photodiode area to the drive transistor, silicon attack, which occurs at the upper portion of the photodiode area due to damage incurred when forming the contact, can be reduced. This reduction in silicon attack can result in improved noise prevention.

In addition, according to many embodiments, because the contact and the metal interconnection formed in the photodiode area to connect the photodiode area to the drive transistor are omitted, light incident into the photodiode area from the transistor area may not be blocked, so that color variation in the image can be reduced.

Furthermore, by omitting the contact and the metal interconnection connecting the photodiode area to the drive transistor, the metal interconnection margin is sufficiently ensured when designing the pixels, thereby improving space utilization.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing an image sensor, the method comprising the steps of:
   forming an isolation area and defining an active area on a substrate;
   forming a photodiode area and a transistor area on the active area;
   forming a gate insulating layer on the transistor area, wherein forming the gate insulating layer on the transistor area comprises:
      forming an insulating layer on an entire surface of the substrate; and
      selectively etching the insulating layer such that the gate insulating layer remains on the transistor area and not on the photodiode area; and
   forming a gate electrode on the gate insulating layer and over a portion of the isolation area onto a portion of the photodiode area.

2. The method according to claim 1, wherein the gate insulating layer and the gate electrode provide a drive transistor.

3. The method according to claim 1, wherein forming the gate electrode on the gate insulating layer and over the portion of the isolation area onto the portion of the photodiode area provides an electrical connection between the photodiode area and the gate electrode.

4. The method according to claim 1, wherein the gate electrode includes polysilicon.

5. The method according to claim 1, wherein forming the gate electrode on the gate insulating layer and over the portion of the isolation area onto the portion of the photodiode area comprises depositing a polysilicon layer on the substrate after selectively etching the insulating layer.

* * * * *